United States Patent [19]
Rochard

[11] Patent Number: 6,141,257
[45] Date of Patent: Oct. 31, 2000

[54] DEVICE FOR THE CONFIGURATION OF OPTIONS IN AN INTEGRATED CIRCUIT AND IMPLEMENTATION METHOD

[75] Inventor: Laurent Rochard, Cabries, France

[73] Assignee: STMicroelectronics S.A., Gentilly, France

[21] Appl. No.: 09/301,505

[22] Filed: Apr. 28, 1999

[30] Foreign Application Priority Data

Apr. 30, 1998 [FR] France .................................. 98 05572

[51] Int. Cl.⁷ ...................................................... G11C 7/02
[52] U.S. Cl. ...................................... 365/189.05; 365/210
[58] Field of Search ............................. 365/189.05, 210, 365/205, 207, 208

[56] References Cited

U.S. PATENT DOCUMENTS 5,335,198  8/1994  Van Buskirk et al. ................. 365/218
5,917,753  6/1999  Dallabora et al. .................. 365/185.21

FOREIGN PATENT DOCUMENTS 0 293 339 A1  11/1988  European Pat. Off. .
0 396 263 A2  11/1990  European Pat. Off. .
3921404 A1   2/1990  Germany .

OTHER PUBLICATIONS

Saroj Pathak, et al, "A 25–ns 16K CMOS PROM Using a Four–Transistor Cell and Differential Design Techniques", Oct. 1985, IEEE Journal of Solid State Circuits, vol. 20, No. 5, pp. 964–970.

French Search Report dated Jan. 13, 1999 with annex on French Application No. 98–05572.

*Primary Examiner*—Vu A. Le
*Attorney, Agent, or Firm*—Theodore E. Galanthay; Fleit, Kain, Gibbons, Gutman & Bongini PL

[57] ABSTRACT

An option configuration device in an integrated circuit including, for each option bit to be configured, a configuration stage that includes a first set of non-volatile memory cells parallel-connected between a first node and a ground connection, and a second set of non-volatile memory cells parallel-connected between a second node and a ground connection. The first and second nodes are each connected to an input of a read circuit including a differential amplifier.

17 Claims, 3 Drawing Sheets

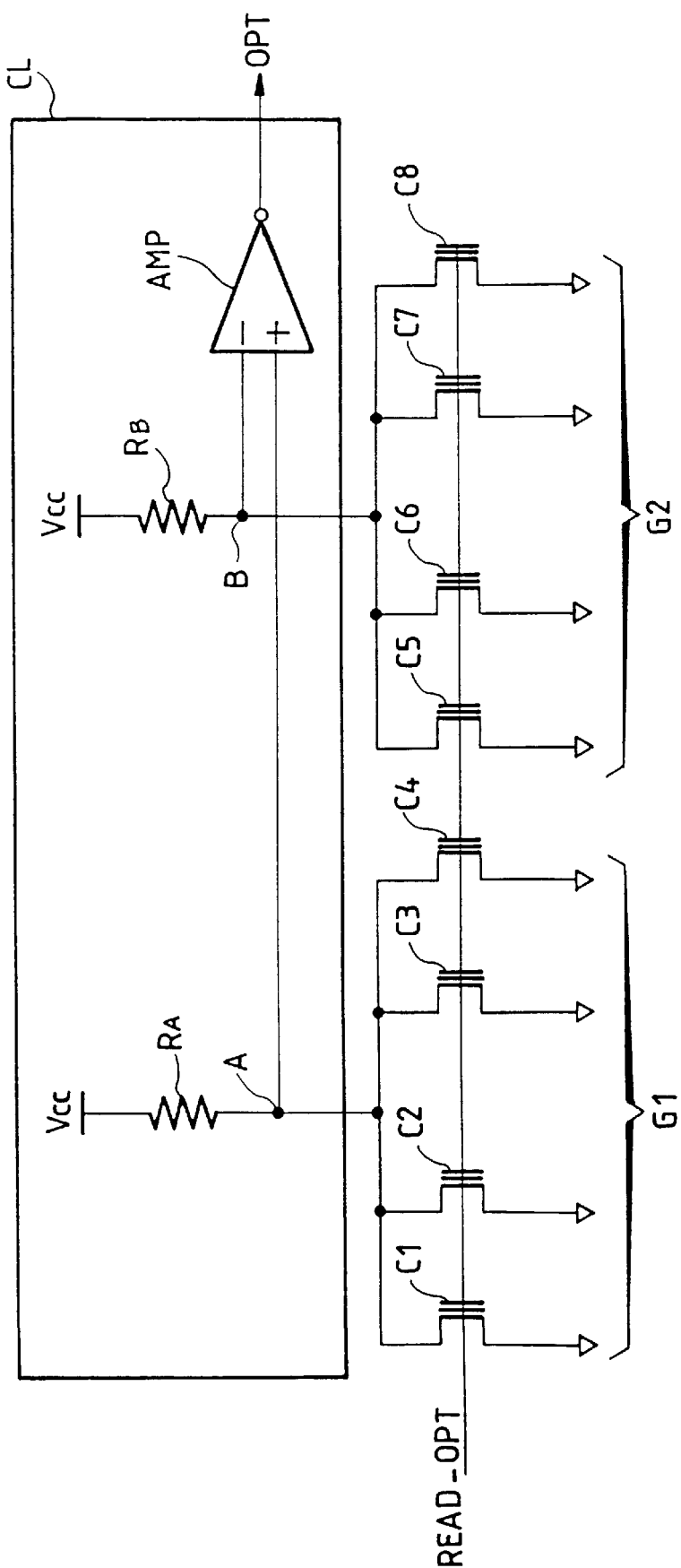

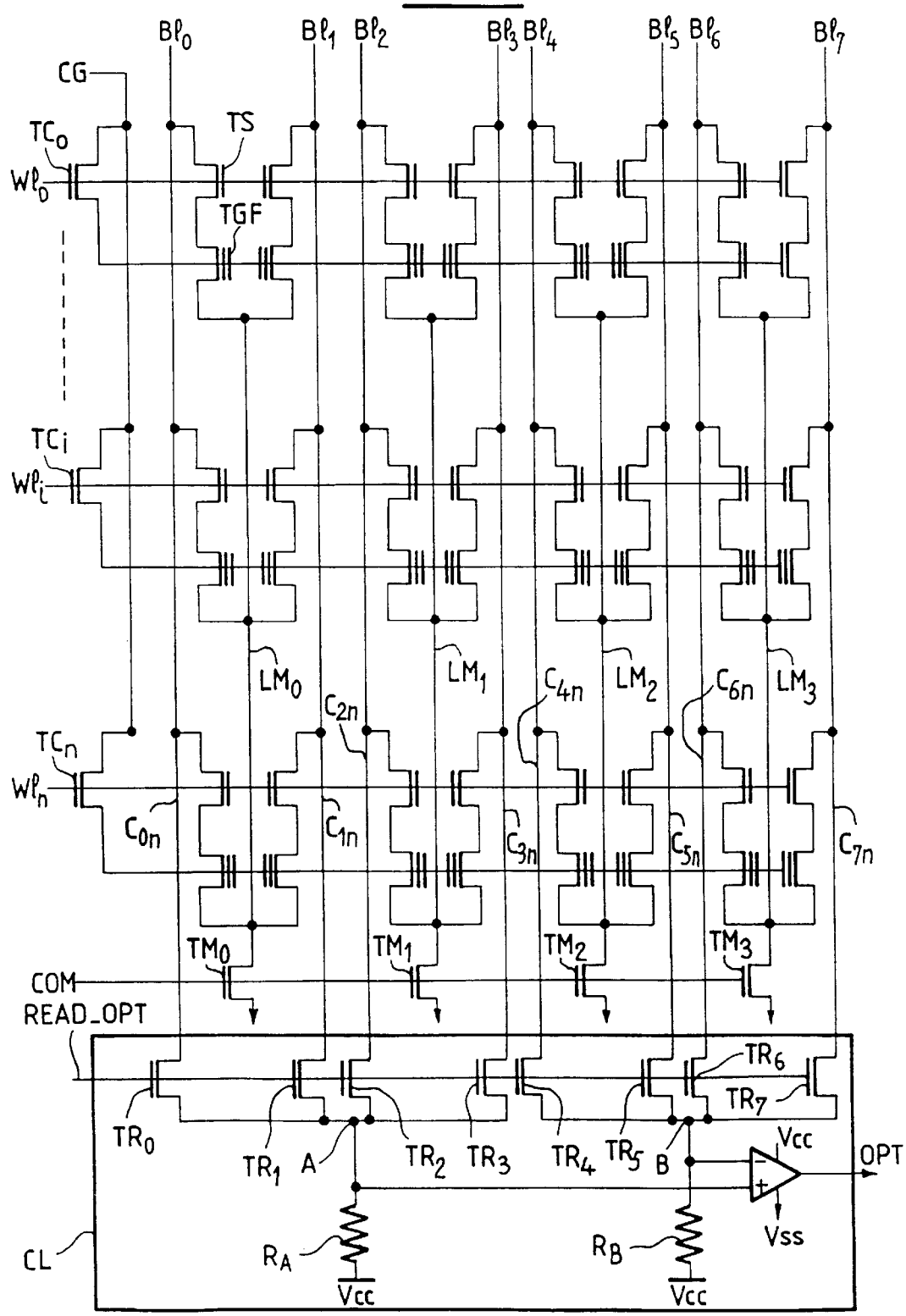
FIG_2

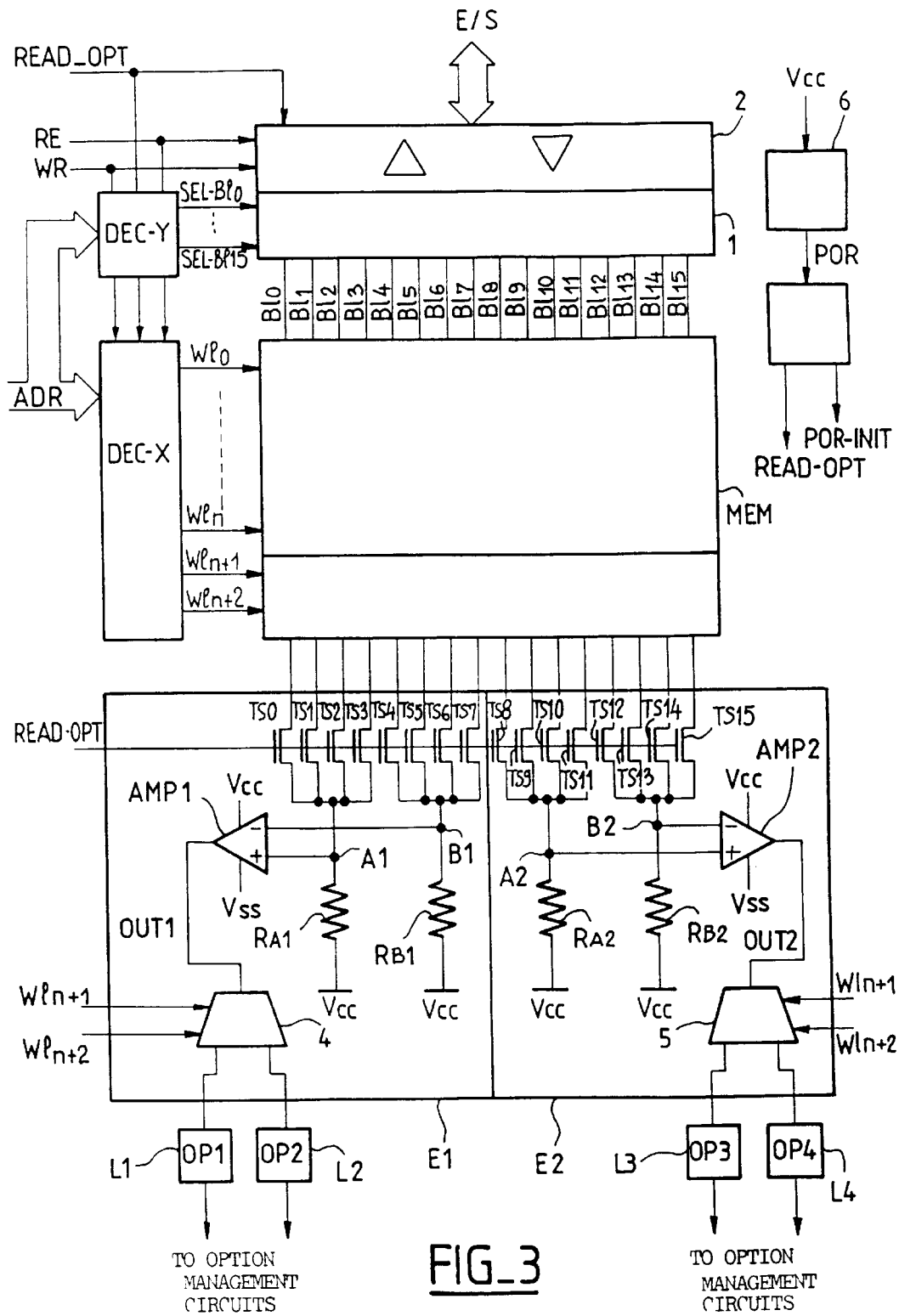
FIG_3

DEVICE FOR THE CONFIGURATION OF OPTIONS IN AN INTEGRATED CIRCUIT AND IMPLEMENTATION METHOD

CROSS REFERENCE TO RELATED APPLICATIONS

This application is based on and claims priority from prior French Patent Application No. 98-05572, filed Apr. 30, 1998, the entire disclosure of which is herein incorporated by reference.

BACKGROUND OF THE INVENTION

The present invention relates generally to integrated semiconductor circuits and more specifically to a device for the configuration of options in an integrated circuit and to an associated method of implementation.

For reasons of manufacturing cost, it would be desirable to increase the number of options available in one integrated circuit. In a given range of products, a single circuit with several options would enable the replacement of several different integrated circuits. Thereby, the cost of design and manufacture would be reduced. It is thus desirable to provide users of circuits with wider possibilities of configuration and hence of use, to reduce the demand for customized circuits which are costly to make.

One solution to this need is to provide an option configuration device in an integrated circuit. This device is electrically programmable to enable the user to configure his circuit himself.

Usually, the configuration device comprises electrically programmable non-volatile memory elements associated with latch elements. In general, for each option bit, the corresponding configuration circuit comprises two non-volatile memory cells, one at each input of the latch. In the initial state, when each integrated circuit comes off the production line, the two memory cells are blank. The configuration consists in programming one of the cells. Depending on the cell that is programmed, an option configuration bit is obtained at output of the latch equal to 0 or to 1. This bit is applied to the management circuitry of the corresponding option.

One drawback of these option configuration devices with non-volatile memory cells and latches is that it is possible that a cell that has been programmed changes its state, following leakages of current or a parasitic phenomenon of programming or erasure known as "soft programming" or "soft erasing" which may occur when the cell is biased in the read mode. The option bit then assumes a false value. The result is a problem of reliability of the integrated circuits with option configuration.

SUMMARY OF THE INVENTION

It is an object of the present invention to resolve this technical problem.

Briefly in accordance with the invention, an option configuration device comprises a unique structure, enabling considerable improvement in the reliability of the device. According to the invention, two groups of non-volatile memory cells are used, one for each complementary state (blank or erased and programmed), associated with a read circuit with a differential amplifier. Each group comprises several parallel-connected non-volatile memory cells. So long as at least cells of the group which have been programmed remain programmed, the differential amplifier delivers the right logic level of the option configuration bit at output.

Preferably, in an integrated circuit comprising a non-volatile memory organized in matrix form in bit lines and word lines, the cells of each stage of the option configuration device are cells of a word line of the non-volatile memory.

As characterized, the invention therefore relates to an option configuration device in an integrated circuit. According to the invention, this option configuration device comprises, for each option bit to be configured, a configuration stage comprising a first set of non-volatile memory cells parallel-connected between a first node and ground, and a second set of non-volatile memory cells parallel-connected between a second node and ground. The first and second nodes are each connected to an input of a read circuit comprising a differential amplifier.

Other objects, features, and advantages of the present invention will become apparent from the following detailed description. It should be understood, however, that the detailed description and specific examples, while indicating preferred embodiments of the present invention, are given byway of illustration only and various modifications may naturally be performed without deviating from the present invention.

BRIEF DESCRIPTION OF THE DRAWINGS

FIG. 1 is a diagram of a stage of an option configuration device according to the invention;

FIG. 2 shows an option configuration device using cells of an EEPROM type non-volatile memory; and FIG. 3 shows a general architecture of a non-volatile memory associated with an option configuration device according to the invention.

DETAILED DESCRIPTION

FIG. 1 shows a stage of an option configuration device using nonvolatile memory cells. Hereinafter, any reference to memory cells pertains to non-volatile memory cells. These non-volatile memory cells may be of any type, for example of the EPROM, EEPROM or flash EPROM type.

This stage comprises two groups G1 and G2 of non-volatile memory cells. In the example, these memory cells include a floating-gate transistor, corresponding to EPROM or flash EPROM type memory cells.

The first group G1, in the example, has four memory cells C1, C2, C3 and C4 each parallel-connected between a node A and the ground connection.

The second group G2 similarly comprises four memory cells C5, C6, C7 and C8, each parallel-connected between a node B and the ground connection. Preferably, the control gates of the cells of the two groups G1 and G2 are controlled by the same read control signal READ-OPT for the option bits.

Nodes A and B are each applied to an input of a read circuit CL. The Read circuit comprises a differential amplifier (AMP). The output of the differential amplifier provides a configuration bit OPT read in the configuration stage.

In the example, the node A is connected to the negative input—and the node B to the positive input (+) of the differential amplifier AMP. The biasing of the read circuit is done by means of a first resistor (RA) connected between the supply voltage Vcc and node A and a second resistor (RB) connected between the supply voltage Vcc and node B. The two resistors RA and RB have the same electrical resistance R.

According to an aspect of the invention, the programming of the configuration stage consists in programming only one of the two groups, depending on whether the corresponding option bit OPT is to be placed at 1 or at 0. To program a group is to program each of its cells.

If, for example, it is the group G1 that is programmed, when the read operation is done the programmed cells of the group G1 are conductive while the cells of the group G2 which are blank or erased are not conductive. This imbalance between the inputs causes the amplifier to switch over into one direction or the other. In this example, a logic 1 is obtained at output OPT.

If one or more cells of the group G1 get deprogrammed in the course of time, especially owing to leakages in these cells or the phenomenon of soft programming or soft erasing, so long as at least one of the cells remains programmed, the output OPT of the differential amplifier remains unchanged. In this way, the reliability of the configuration circuit is improved. There are fewer defective integrated circuits that come off the production line and, especially, the lifetime of these circuits is thereby appreciably improved.

In practice, the resistors RA and RB are sized as a function of the technology of the memory cells and of the working characteristics of the differential amplifier, in order that this amplifier will remain in its operational zone of differential operation, whether all the cells of the program are conductive or whether only one of these cells is conductive. This sizing depends on the memory technology of the cells as well as on the number of the cells parallel-connected in a group.

It will be noted that the differential amplifier read circuit may be used for reading several different stages according to an appropriate sequencing. This makes it possible to limit the option configuration circuitry.

In practice, the option configuration device according to the invention, which no longer uses any latches as in the prior art but only parallel-connected memory cells associated with the differential amplifier, can be integrated advantageously into the architecture of a non-volatile memory. This is shown if FIG. 2.

Referring to FIG. 2 there is shown an option configuration device using a matrix of EEPROM type non-volatile memory cells.

It is known that an EEPROM type non-volatile memory cell comprises a floating-gate transistor associated with two selection transistors. In the example shown, for each cell there is a first selection transistor TS series-connected with a floating-gate transistor TGF between the associated bit line B10 for example, and a ground line $LM_1$ in the example. A second selection transistor referenced $TC_0$ is provided. This transistor $TC_0$ controls the gate of the floating-gate transistor. In the example, there is one transistor $TC_0$, $TC_n$ per word line $W1_0$, $W1_n$. It therefore controls all the cells of a same word line for the application, when the corresponding word line is selected, of a bias voltage CG to the control gate of these cells.

In the example, there is one ground line for two adjacent bit lines. The ground line $LM_0$, $LM_1$, $LM_2$, $LM_3$ respectively is associated with the adjacent bit lines, respectively $BI_0$ and $BI_1$, $BI_2$ and $BI_3$, $BI_4$ and $BI_5$ and $BI_6$ and $BI_7$. Each of these ground lines is connected to an associated ground selector switch transistor $TM_0$, $TM_1$, $TM_2$ and $TM_3$. These selector switch transistors are controlled by a control signal COM. This signal is especially activated in the memory cell read mode to connect these lines to the electrical ground of the integrated circuit. When this cell is not activated, these lines are insulated from the electrical ground.

The invention uses cells of the memory array to set up each option configuration stage. The cells of one and the same configuration stage will preferably be located on one and the same word line so as to enable them to be selected in read mode by selecting the associated word line. In the example, the cells $C_{0n}$ to $C_{7n}$ of the option configuration stage are located on the last word line $W1_n$.

In this exemplary embodiment, the configuration stage furthermore comprises one option selection transistor per cell, connected between the corresponding bit line and the node A or B of the configuration stage, depending on whether the corresponding cell belongs to the group G1 or to the group G2 of the stage. Thus, the option selection transistor TR0, TR1, TR2 and TR3 respectively is connected respectively between the bit line $BI_0$, $BI_1$, $BI_2$, $BI_3$ respectively and the node A. Similarly, the option selection transistor TR4, TR5, TR6, TR7 respectively is connected between the bit line $BI_4$, $BI_5$, $BI_6$, $BI_7$ respectively and the node B. The configuration stage is connected to a read circuit CL with associated differential amplifier AMP, with the resistor RA connected to the node A, the resistor RB connected to the node B, as already described in FIG. 1.

In this practical embodiment, the signal READ-OPT used to control the reading of the memory cells and give the option bit at the output OPT of the differential amplifier is applied to the selection transistors TR0 to TR7 which enable the cells to be actively connected to the nodes A and B of the device or to be insulated from them.

To obtain the option bit at output OPT of the differential amplifier OPT, it is necessary in practice to select the word line $WI_n$ in read mode, namely to bias it at Vcc and activate the control signal READ-OPT to turn the option selection transistors on. The bit line should not be selected by the bit line decoder. The signal COM must also be activated to connect the word lines $LM_0$ to $LM_3$ to the electrical ground of the integrated circuit. The signal CG will be biased in the same way as during a normal read operation (VCG#1 volt). The bias values and equivalent electrical connections described and shown in FIG. 1 are then found again.

As a trade-off for the addition of a control mode for the memory corresponding to the activation of the signal READ-OPT, enabling the selection in read mode of the word line corresponding to the option configuration stage, the ground connection of the ground lines of the memory array and the non-selection of the bit lines, a very advantageous option configuration stage is obtained at low cost: there is very little circuitry to be added and the reliability of the configuration device is increased. Furthermore, the memory cells used in the option configuration device according to the invention are accessible in all the modes of operation of the memory, by using the resources of this memory. In particular, the cells can be read by the read circuit of the memory itself. Depending on the type of memory, the memory programming or erasure mode can be used for any of its cells whatsoever. The result thereof is a simplification of the structure of the configuration device that uses the resources of the memory. The reliability is thus increased by the multiplication of the cells in the device as well as the possibility of implementing a test routine in which the cells are read by the read circuit of the memory to control their state and reprogram those that have been deprogrammed.

FIG. 3 shows a more general block diagram of an integrated circuit comprising a non-volatile memory whose memory cells can be used in an option configuration device according to the invention. This figure shows in particular, around the memory array MEM, of the address bus ADR, the word line decoders DEC-X, and the associated bit lines DEC-Y, the gate circuit 1 controlled by the bit line decoder and connected firstly to these bit lines and secondly to the input/output circuit 2 which includes the read and write amplifiers connected to the data input/output bus E/S.

The input/output circuit and the decoders DEC-X and DEC-Y receive the memory read and write control signals RE and WR. They furthermore receive the control signal READ-OPT for the reading of the option bits. This signal enables the selection in read mode of a word line used by the configuration device, without selecting any bit line, to actively connect these bit lines to the differential amplifiers of the read circuits CL for the option bit. Furthermore, a circuit (not shown) enables the activation of the signal COM not only in memory cell read mode (RE), but also in option bit read mode (READ-OPT) to connect the ground lines to the electrical ground of the integrated circuit.

In the example, the option configuration device according to the invention uses two word lines of the memory $WI_{n+1}$, and $WI_{n+2}$. They each comprise 16 memory cells and are each connected to an associated bit line $BI_0$ to $BI_{15}$.

This makes it possible to obtain four configuration stages according to the invention. The bit lines $BI_0$ to $BI_7$ are associated with two option configuration stages, one on the word line $WI_{n+1}$, the other on the word line $WI_{n+2}$, just like the bit lines $BI_8$ to $BI_{15}$.

In the example, the option configuration device comprises two read circuits with differential amplifier. The bit lines $BI_0$ to $BI_7$ are associated with a first option bit read circuit while the bit lines $BI_8$ to $BI_{15}$ are associated with a second option bit read circuit E2. The first read circuit E1 comprises the selection transistors Ts0 to Ts7 connected to the corresponding bit lines, the resistors RA1 and RB1 and the differential amplifier AMP1 with an output OUT1. Depending on the word line $WI_{n+1}$ or $WI_{n+2}$ selected in option reading, the output OUT1 gives the corresponding option bit. This output is switched over to one output or the other, $OP_1$ or $OP_2$, of a demultiplexer 4.

Similarly, the second read circuit E2 comprises the selection transistors Ts8 to Ts15 connected to the corresponding bit lines, the resistors RA2 and R82 and the differential amplifier, AMP2 with an output OUT2. Depending on the word line $WI_{n+1}$ or $WI_{n+2}$ selected in option bit read mode (READ-OPT), the output OUT2 gives the corresponding option bit. This output is switched over to either output, $OP_3$ or $OP_4$, of a demultiplexer 5.

Other arrangements between the configuration stages and the read circuit CL are possible. It is also possible to use one and the same read circuit for the configuration stages associated with different bit lines, provided that there are appropriate selector switch circuits used. The choice of a particular arrangement depends chiefly on the application considered.

Preferably, each option bit is stored in a latch type register. In the example, the option bits $OP_1$, $OP_2$, $OP_3$, $OP_4$ are each stored in a latch L1, L2, L3, L4. These registers or latches are connected at output to the management circuit of the corresponding options.

The implementation of the option configuration device according to the invention then comprises a phase to initialize the registers or latches L1 to L4 which consists in reading the configuration stages and storing the option bits read in these registers.

This sequence of reading the option bits and of storage in the latches is advantageously performed during the initialization of the integrated circuit. It is known that this initialization is activated when an appropriate detection circuit 6 detects the powering on of the integrated circuit. This circuit gives a detection signal POR that enables the initialization especially of the registers to be activated. In the invention, this signal POR activates the READ-OPT signal for the time needed to read all the stages of the configuration device. In the example, there are four read operations to be performed but since two stages are on the same word line, it is possible to carry out the reading of both stages of the same word line at the same time. The read sequence consists, therefore, when the signal READ-OPT is activated, in selecting a first word line, for example $WI_{+1}$, and in performing the reading and storage of the corresponding option bits $OP_1$ and $OP_3$ in the registers L1 and L3, then selecting the other word line $W_{n+2}$ and carrying out the reading and storage of the corresponding option bit $OP_2$ and $OP_4$ in the registers L2 and L4. These management circuits connected to these registers are initialized. The integrated circuit is operational.

Then, the signal READ-OPT is deactivated.

The memory cells of the different stages are furthermore always accessible through the read and write resources of the memory. The corresponding data elements are read or written by means of the input/output bus of the memory. This enables an internal or external configuration (namely configuration by another integrated circuit) of the option bit and an internal or external checking of the state of the cells in a test routine.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An option configuration device in an integrated circuit comprising, for each option bit to be configured, a configuration stage comprising: a first set of non-volatile memory cells parallel-connected between a first node and a ground connection; and a second set of non-volatile memory cells parallel-connected between a second node and a ground connection, said first and second nodes being each connected to an input of a read circuit comprising a differential amplifier.

2. The configuration device of claim 1 comprising the read circuit, and wherein the first and second nodes are each coupled to an input of the differential amplifier.

3. The configuration device of claim 2, wherein the read circuit comprises a first resistor disposed between a supply voltage Vcc connection and a first input of the differential amplifier and a second resistance disposed between the supply voltage Vcc connection and a second input of the differential amplifier.

4. The configuration device of claim 3, wherein the resistors of each read circuit is equal and sized so that the differential amplifier remains in differential operation mode whether only one or all the cells of a set of cells of a configuration stage are conductive.

5. The configuration device of claim 2, wherein each group of each configuration stage comprises four parallel-connected cells.

6. The configuration device of claim 3, wherein each group of each configuration stage comprises four parallel-connected cells.

7. The configuration device of claim 4, wherein each group of each configuration stage comprises four parallel-connected cells.

8. The configuration device of claim 2, wherein the cells are cells of a non-volatile memory, and the cells of one configuration stage are located in the plane of the memory, on one word line.

9. The configuration device of claim 2, wherein each read circuit is associated with one or more option configuration stages.

10. An integrated circuit comprising an option configuration device for configuring at least one option bit, the option configuration device comprising: for each option bit to be configured, a configuration stage comprising: a first set of non-volatile memory cells parallel-connected between a first node and a ground connection; and, a second set of non-volatile memory cells parallel-connected between a second node and a ground connection, said first and second nodes being each connected to an input of a read circuit with differential amplifier.

11. The integrated circuit of claim 10, wherein each read circuit comprises a first resistor disposed between a supply voltage Vcc connection and a first input of the differential amplifier and a second resistance disposed between the supply voltage Vcc connection and a second input of the differential amplifier.

12. The integrated circuit of claim 11, wherein the resistors of each read circuit is equal and sized so that the differential amplifier remains in differential operation mode whether only one or all the cells of a set of cells of a configuration stage are conductive.

13. The integrated circuit of claim 10, wherein each group of each configuration stage comprises four parallel-connected cells.

14. The integrated circuit of claim 10, wherein the cells are cells of a non-volatile memory, and the cells of one configuration stage are located in the plane of the memory, on one word line.

15. The integrated circuit of claim 10, wherein each read circuit is associated with one or more option configuration stages.

16. The integrated circuit of claim 10 further comprising means for reading each option bit, and for enabling the reading of option bits during initialization of the integrated circuit, responsive to the detection of powering on of the integrated circuit, and storing of the option bits.

17. In an integrated circuit comprising with a non-volatile memory and an option configuration device for configuring at least one option bit, a method for the implementation of the option configuration device comprising the steps of:

reading the at least one option bit during the initialization of the integrated circuit and activated by the detection of its powering on, and storing the option bits in registers.

* * * * *